United States Patent
Takigawa

(10) Patent No.: US 11,791,798 B2
(45) Date of Patent: Oct. 17, 2023

(54) ACOUSTIC WAVE DEVICE

(71) Applicant: Murata Manufacturing Co., Ltd., Nagaokakyo (JP)

(72) Inventor: Kazuhiro Takigawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 718 days.

(21) Appl. No.: 16/674,011

(22) Filed: Nov. 5, 2019

(65) Prior Publication Data

US 2020/0076404 A1 Mar. 5, 2020

Related U.S. Application Data

(63) Continuation of application No. PCT/JP2018/018690, filed on May 15, 2018.

(30) Foreign Application Priority Data

May 22, 2017 (JP) ................................. 2017-100584

(51) Int. Cl.
*H03H 9/25* (2006.01)
*H03H 9/02* (2006.01)
*H03H 9/145* (2006.01)

(52) U.S. Cl.
CPC .......... *H03H 9/25* (2013.01); *H03H 9/02559* (2013.01); *H03H 9/02637* (2013.01);
(Continued)

(58) Field of Classification Search
CPC .. H03H 9/25; H03H 9/02559; H03H 9/02637; H03H 9/02889; H03H 9/02992; H03H 9/14541
See application file for complete search history.

(56) References Cited

U.S. PATENT DOCUMENTS 7,939,987 B1 * 5/2011 Solal .................. H03H 9/02645
333/195
2013/0051588 A1 2/2013 Ruile et al.
(Continued)

FOREIGN PATENT DOCUMENTS

JP 2012-186808 A 9/2012
JP 2013-518455 A 5/2013
(Continued)

OTHER PUBLICATIONS

Official Communication issued in International Patent Application No. PCT/JP2018/018690, dated Jul. 17, 2018.

*Primary Examiner* — Samuel S Outten
(74) *Attorney, Agent, or Firm* — KEATING & BENNETT, LLP

(57) ABSTRACT

An acoustic wave device includes a piezoelectric substrate, and an IDT electrode provided on the piezoelectric substrate. The IDT electrode includes an overlap region where first and second electrode fingers overlap each other in a first direction. The overlap region includes a central region located in a substantially central portion of the overlap region with respect to a second direction. The central region includes a low acoustic velocity portion with an acoustic velocity less than the acoustic velocity in another portion. The overlap region includes first and second low acoustic velocity regions. The first and second low acoustic velocity regions are respectively located on first-and-second-busbar sides from the central region. The IDT electrode includes first and second high acoustic velocity regions. The first and second high acoustic velocity regions are respectively located outside the first and second low acoustic velocity regions with respect to the second direction.

18 Claims, 7 Drawing Sheets

(52) U.S. Cl.
CPC .... *H03H 9/02889* (2013.01); *H03H 9/02992* (2013.01); *H03H 9/14541* (2013.01)

(56) References Cited

U.S. PATENT DOCUMENTS

| | | |
|---|---|---|
| 2013/0249647 A1 | 9/2013 | Nakanishi et al. |
| 2016/0065176 A1* | 3/2016 | Taniguchi ............ H03H 9/6426 333/195 |
| 2017/0047905 A1 | 2/2017 | Araki et al. |
| 2017/0264262 A1 | 9/2017 | Nakazawa et al. |
| 2017/0331451 A1 | 11/2017 | Yoon et al. |

FOREIGN PATENT DOCUMENTS

| | | |
|---|---|---|
| JP | 2013-544041 A | 12/2013 |
| JP | 2016-178387 A | 10/2016 |
| JP | 2017-163481 A | 9/2017 |
| WO | 2015/182522 A1 | 12/2015 |
| WO | 2016/095967 A1 | 6/2016 |

\* cited by examiner

ACOUSTIC WAVE DEVICE

CROSS REFERENCE TO RELATED APPLICATIONS

This application claims the benefit of priority to Japanese Patent Application No. 2017-100584 filed on May 22, 2017 and is a Continuation Application of PCT Application No. PCT/JP2018/018690 filed on May 15, 2018. The entire contents of each application are hereby incorporated herein by reference.

BACKGROUND OF THE INVENTION

1. Field of the Invention

The present invention relates to an acoustic wave device employing a piston mode.

2. Description of the Related Art

Acoustic wave devices employing a piston mode have been proposed to suppress unwanted waves.

One exemplary acoustic wave device employing a piston mode is disclosed in, for example, Japanese Unexamined Patent Application Publication No. 2012-186808. Such an acoustic wave device includes an interdigital transducer (IDT) electrode disposed on a piezoelectric substrate. The IDT electrode includes an overlap region where, as viewed in the direction of acoustic wave propagation, a plurality of first electrode fingers and a plurality of second electrode fingers overlap each other. The overlap region includes a central region located in a central area with respect to a direction orthogonal to the direction of acoustic wave propagation, and an edge region located in each outer side portion of the central region. Further, a gap region is located outside each edge region.

The edge region is a low acoustic velocity region with an acoustic velocity less than the acoustic velocity in the central region. The gap region is a high acoustic velocity region with an acoustic velocity greater than the acoustic velocity in the central region. By positioning the central region, the low acoustic velocity region, and the high acoustic velocity region in the stated order, acoustic wave energy is confined, and transverse-mode spurious responses are suppressed.

With the acoustic wave device described in Japanese Unexamined Patent Application Publication No. 2012-186808, a deviation from an optimum condition for transverse mode suppression may result in large ripples due to lower-order transverse modes.

SUMMARY OF THE INVENTION

Preferred embodiments of the present invention provide acoustic wave devices that are each able to significantly reduce or prevent ripples due to lower-order transverse modes.

An acoustic wave device according to a preferred embodiment of the present invention includes a piezoelectric substrate, and an interdigital transducer (IDT) electrode provided on the piezoelectric substrate. The IDT electrode includes a first busbar and a second busbar that face each other, a plurality of first electrode fingers and a plurality of second electrode fingers, the first electrode fingers being connected at one end to the first busbar, the second electrode fingers being connected at one end to the second busbar and interdigitated with the first electrode fingers, and an overlap region where, when the direction of acoustic wave propagation is defined as a first direction and the direction orthogonal to the direction of acoustic wave propagation is defined as a second direction, the first electrode fingers and the second electrode fingers overlap each other in the first direction. The overlap region includes a central region located in a substantially central portion of the overlap region with respect to the second direction. The central region includes a low acoustic velocity portion with an acoustic velocity less than an acoustic velocity in another portion of the central region. The overlap region includes a first low acoustic velocity region located on the first-busbar side from the central region, the first low acoustic velocity region being a region with an acoustic velocity less than the acoustic velocity in the other portion of the central region, and a second low acoustic velocity region located on the second-busbar side from the central region, the second low acoustic velocity region being a region with an acoustic velocity less than the acoustic velocity in the another portion of the central region. The IDT electrode includes a first high acoustic velocity region with an acoustic velocity greater than an acoustic velocity in the central region, and a second high acoustic velocity region with an acoustic velocity greater than the acoustic velocity in the central region. The first high acoustic velocity region is located outside the first low acoustic velocity region with respect to the second direction, and the second high acoustic velocity region is located outside the second low acoustic velocity region with respect to the second direction.

In an acoustic wave device according to a preferred embodiment of the present invention, the acoustic velocity in each of the first low acoustic velocity region and the second low acoustic velocity region is less than the acoustic velocity in the low acoustic velocity portion of the central region.

In an acoustic wave device according to a preferred embodiment of the present invention, the low acoustic velocity portion has a dimension in the second direction less than a dimension in the second direction of each of the first low acoustic velocity region and the second low acoustic velocity region. This configuration provides significant reduction or prevention of lower-order transverse modes while reducing impact on the reduction or prevention of higher-order transverse modes.

In an acoustic wave device according to a preferred embodiment of the present invention, the low acoustic velocity portion includes a first mass addition film provided on at least one of each first electrode finger and each second electrode finger.

In an acoustic wave device according to a preferred embodiment of the present invention, the first low acoustic velocity region and the second low acoustic velocity region each include a second mass addition film provided on at least one of each first electrode finger and each second electrode finger, and the first mass addition film has a dimension in the second direction less than a dimension in the second direction of the second mass addition film. This configuration provides significant reduction or prevention of lower-order transverse modes while reducing impact on the reduction or prevention of higher-order transverse modes.

In an acoustic wave device according to a preferred embodiment of the present invention, the first low acoustic velocity region and the second low acoustic velocity region include a second mass addition film provided on at least one of each first electrode finger and each second electrode finger, and the first mass addition film has a dimension in the first direction less than a dimension in the first direction of the second mass addition film. This configuration provides significant reduction or prevention of lower-order transverse modes while reducing impact on the reduction or prevention of higher-order transverse modes.

In an acoustic wave device according to a preferred embodiment of the present invention, a plurality of the first mass addition films are provided, the first mass addition films being provided on at least one electrode finger, the at least one electrode finger being at least one electrode finger among the first electrode fingers and the second electrode fingers. With this configuration, in forming the IDT electrode by a lift-off method, a stripping solution used to strip a resist pattern is allowed to readily flow into an area corresponding to each of the first and second electrode fingers. This provides reliable stripping of the resist pattern.

In an acoustic wave device according to a preferred embodiment of the present invention, the first mass addition films are arranged in line symmetry about an axis, the axis being located at the center of the central region with respect to the second direction and extending in the first direction.

In an acoustic wave device according to a preferred embodiment of the present invention, a plurality of the first mass addition films are provided, the first mass addition films being arranged in point symmetry about the center of the central region with respect to the first direction and the second direction.

In an acoustic wave device according to a preferred embodiment of the present invention, a plurality of the first mass addition films are provided, the first mass addition films being provided at a position including the center of the central region with respect to the second direction, the first mass addition films being aligned in the first direction.

In an acoustic wave device according to a preferred embodiment of the present invention, on the piezoelectric substrate, a reflector including a plurality of electrode fingers is located at least on one side of the IDT electrode with respect to the first direction, and a third mass addition film is provided on each electrode finger of the reflector. With this configuration, in forming the IDT electrode by a lift-off method, a stripping solution used to strip a resist pattern is allowed to readily flow into an area corresponding to the reflector. This provides reliable stripping of the resist pattern.

Acoustic wave devices according to the preferred embodiments of the present invention provide significant reduction or prevention of ripples due to lower-order transverse modes.

The above and other elements, features, steps, characteristics and advantages of the present invention will become apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to facilitate understanding of the present invention.

It is to be noted that various preferred embodiments described herein are for illustrative purposes only, and some features or elements described with respect to different preferred embodiments may be substituted for or combined with one another.

Figure 1:
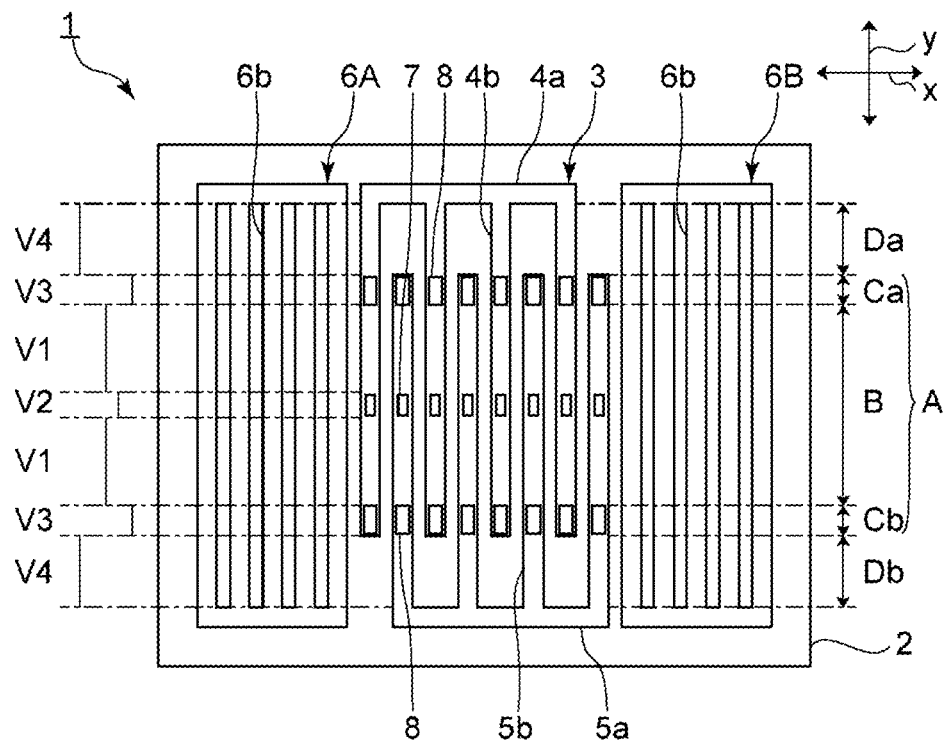
FIG. 1 is a plan view of an acoustic wave device according to a first preferred embodiment of the present invention.

FIG. 1 is a plan view of an acoustic wave device according to a first preferred embodiment of the present invention.

An acoustic wave device 1 includes a piezoelectric substrate 2. In the first preferred embodiment, the piezoelectric substrate 2 is preferably made of $LiNbO_3$, for example. The piezoelectric substrate 2 may include a piezoelectric single crystal other than $LiNbO_3$, for example, $LiTaO_3$, or may include a suitable piezoelectric ceramic material. The acoustic wave device 1 may include a piezoelectric substrate with a piezoelectric film stacked on a support substrate. As the piezoelectric film, the above-mentioned piezoelectric single crystal or any other suitable material may be used.

An IDT electrode 3 is provided on the piezoelectric substrate 2. The IDT electrode 3 includes a first busbar 4a and a second busbar 5a that face each other. The IDT electrode 3 includes a plurality of first electrode fingers 4b connected at one end to the first busbar 4a. Further, the IDT electrode 3 includes a plurality of second electrode fingers 5b connected at one end to the second busbar 5a. Each first electrode finger 4b and each second electrode finger 5b are interdigitated with each other.

The IDT electrode 3 preferably includes a multilayer metal film including, for example, a NiCr layer, a Pt layer, a Ti layer, an AlCu layer, and a Ti layer stacked in the stated order over the piezoelectric substrate 2. The IDT electrode 3 may not necessarily include the above-mentioned material. The IDT electrode 3 may include a single-layer metal film.

An acoustic wave is excited upon application of alternating-current voltage to the IDT electrode 3. With the direction of acoustic wave propagation defined as a first direction x, a reflector 6A and a reflector 6B are located on opposite sides of the IDT electrode 3 with respect to the first direction x. The reflector 6A and the reflector 6B each include a plurality of electrode fingers 6b. The reflector 6A and the reflector 6B include the same or similar material as the IDT electrode 3. Such a reflector may be provided on one side of the IDT electrode 3 with respect to the first direction x.

The IDT electrode 3 includes an overlap region A where the first electrode fingers 4b and the second electrode fingers 5b overlap each other in the first direction x. A direction orthogonal or substantially orthogonal to the first direction x is defined as a second direction y. In the first preferred embodiment, the first electrode fingers 4b and the second electrode fingers 5b extend in a direction parallel or substantially parallel to the second direction y. The overlap region A includes a central region B located in a substantially central portion of the overlap region A with respect to the second direction y.

In the first preferred embodiment, when $\lambda$ represents the wave length defined by the electrode finger pitch of the IDT electrode 3, preferably $\lambda$=about 4 µm, for example. The IDT electrode 3 preferably has a duty factor of about 0.65, for example. The overlap region A preferably has an overlap width of about 15$\lambda$, for example, where the overlap width is defined as the dimension in the second direction y of the overlap region A. The wave length $\lambda$, duty factor, and overlap width of the IDT electrode 3 are not limited to those mentioned above.

In the central region B, a first mass addition film 7 is provided on each first electrode finger 4b and on each second electrode finger 5b. In the first preferred embodiment, a plurality of such first mass addition films 7 are provided at a position including the center of the central region B with respect to the second direction y, and aligned in the first direction x. In this regard, it suffices that each first mass addition film 7 is provided on at least one of each first electrode finger 4b and each second electrode finger 5b. Further, it suffices that at least one first mass addition film 7 be provided in the central region B.

The first mass addition film 7 includes a multilayer metal film preferably including, for example, a Ti layer, a Pt layer, and a Ti layer stacked in the stated order over the first electrode fingers 4b and the second electrode fingers 5b. The first mass addition 7 may not necessarily include the above-mentioned material. The first mass addition film 7 may include a single-layer metal film or a dielectric film.

The overlap region A includes a first edge region Ca located on the first-busbar-4a side from the central region B, and a second edge region Cb located on the second-busbar-5a side from the central region B. The IDT electrode 3 includes a first outer region Da located outside the first edge region Ca with respect to the second direction y, and a second outer region Db located outside the second edge region Cb with respect to the second direction y. In the first preferred embodiment, the first outer region Da is located between the first edge region Ca and the first busbar 4a. The second outer region Db is located between the second edge region Cb and the second busbar 5a.

The acoustic velocity in a portion of the central region B where the first mass addition film 7 is provided is greater than the acoustic velocity in other portions of the central region B. The term acoustic velocity as used herein refers to the velocity of acoustic wave propagation in the first direction x. In the first preferred embodiment, the first mass addition film 7 is provided to define a low acoustic velocity portion. Now, the acoustic velocity in a portion of the central region other than the low acoustic velocity portion is defined as V1, and the acoustic velocity in the low acoustic velocity portion is defined as V2. At this time, the relationship V2<V1 is preferably satisfied.

In the first edge region Ca and the second edge region Cb, a second mass addition film 8 is provided on each first electrode finger 4b and on each second electrode finger 5b. As a result, the acoustic velocity in each of the first edge region Ca and the second edge region Cb is less than the acoustic velocity in a portion of the central region B other than the low acoustic velocity portion. When the acoustic velocity in each of the first edge region Ca and the second edge region Cb is defined as V3, the relationship V3<V1 is preferably satisfied. Thus, a first low acoustic velocity region is located in the first edge region Ca, and a second low acoustic velocity region is located in the second edge region Cb.

A plurality of second mass addition films 8 preferably provide a duty factor of about 0.35, for example. Each second mass addition film 8 has a dimension in the second direction y of about 0.6$\lambda$, for example. The first mass addition film 7 has a dimension in the first direction x less than the dimension in the first direction x of the second mass addition film 8. As a result, the acoustic velocity in each of the first low acoustic velocity region and the second low acoustic velocity region is less than the acoustic velocity in the low acoustic velocity portion of the central region B. Thus, the relationship V3<V2 is preferably satisfied.

The dimension in the second direction y of the first mass addition film 7 is also less than the dimension in the second direction y of the second mass addition film 8. The dimensions of the first mass addition film 7 and the dimensions of the second mass addition film 8 are not particularly limited. The second mass addition film 8 includes a material identical to the material of the first mass addition film 7. The second mass addition film 8 may include a material different from the material of the first mass addition film 7.

As shown in FIG. 1, the first electrode fingers 4b are the only portion of the IDT electrode 3 located in the first outer region Da. The second electrode fingers 5b are the only portion of the IDT electrode 3 positioned in the second outer region Db. Consequently, the acoustic velocity in each of the first outer region Da and the second outer region Db is greater than the acoustic velocity in the central region B. When the acoustic velocity of an acoustic wave in each of the first outer region Da and the second outer region Db is defined as V4, the relationship V1<V4 is preferably satisfied. Thus, a first high acoustic velocity region is located in the first outer region Da, and a second high acoustic velocity region is located in the second outer region Db.

The first low acoustic velocity region and the second low acoustic velocity region are located outside the central region B with respect to the second direction y, and the first high acoustic velocity region and the second high acoustic velocity region are respectively located outside the first low acoustic velocity region and the second low acoustic velocity region with respect to the second direction y. This configuration is able to significantly reduce or prevent spurious responses due to transverse modes. The acoustic wave device 1 thus employs a piston mode.

The various acoustic velocities mentioned above preferably have the following relationship: V3<V2<V1<V4. The above-mentioned relationship between the various acoustic velocities is shown in FIG. 1. The acoustic velocity is higher toward the left side of FIG. 1.

The IDT electrode 3, the reflector 6A, and the reflector 6B may be formed by a method, such as a lift-off method, for example.

One characteristic feature of the first preferred embodiment is that the central region B includes a low acoustic velocity portion. This configuration is able to significantly reduce or prevent ripples due to lower-order transverse modes. This will be explained below by comparison between the first preferred embodiment and a comparative example. The term lower-order transverse modes as used herein refer to the third and fifth transverse modes. Higher-order transverse modes refer to transverse modes higher than the fifth mode.

The dimension of each of the first and second low acoustic velocity regions in the second direction is defined as the width of each of the first and second low acoustic velocity regions. By varying the width of each of the first and second low acoustic velocity regions, a plurality of acoustic wave devices having the configuration according to the first preferred embodiment, and a plurality of acoustic wave devices similar in configuration to the first preferred embodiment except for the above-mentioned width were fabricated. Further, a plurality of acoustic wave devices according to a comparative example different from the first preferred embodiment in that the central region does not include any low acoustic velocity portion were fabricated by varying the width of each of the first and second low acoustic velocity regions. The magnitude of transverse-mode ripple was measured for each of the fabricated acoustic wave devices mentioned above.

Figure 2:
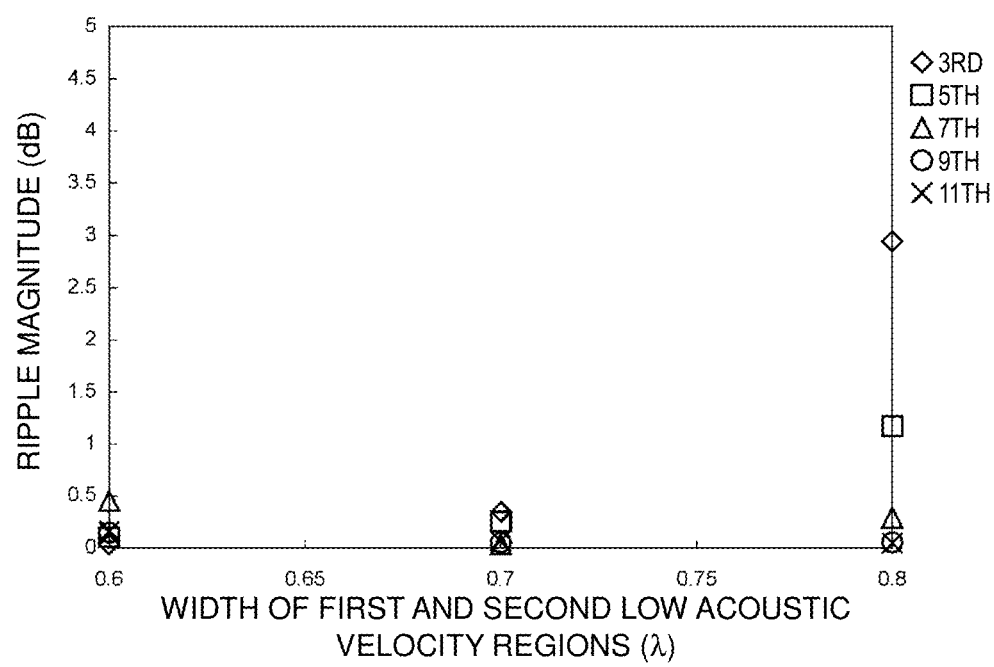
FIG. 2 shows the relationship between the width of each of first and second low acoustic velocity regions and the magnitude of transverse-mode ripple, for an acoustic wave device according to a comparative example.
Figure 3:
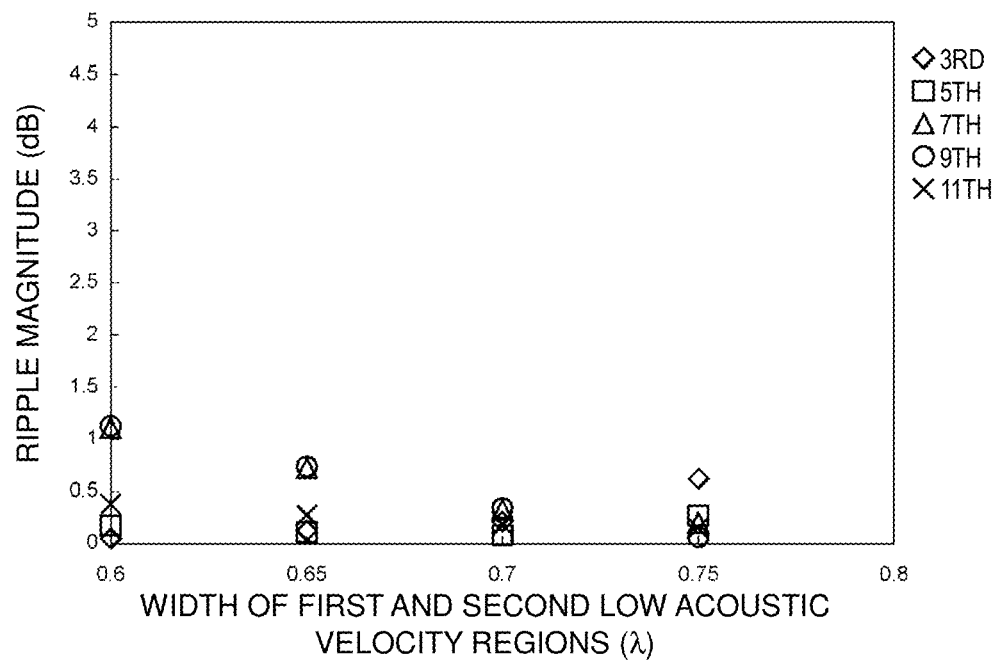
FIG. 3 shows the relationship between the width of each of first and second low acoustic velocity regions and the magnitude of transverse-mode ripple, for the acoustic wave device according to the first preferred embodiment of the present invention.

FIG. 2 shows the relationship between the width of each of the first and second low acoustic velocity regions and the magnitude of transverse-mode ripple, for an acoustic wave device according to a comparative example. FIG. 3 shows the relationship between the width of each of the first and second low acoustic velocity regions and the magnitude of transverse-mode ripple, for the acoustic wave device according to the first preferred embodiment of the present invention. In FIGS. 2 and 3, the plotted rhombuses represent the results for the third transverse mode. The plotted squares represent the results for the fifth transverse mode. The plotted triangles represent the results for the seventh transverse mode. The plotted circles represent the results for the ninth transverse mode. The plotted crosses represent the result for the eleventh transverse mode.

It can be appreciated from FIG. 2 that, with the comparative example, as the width of each of the first and second low acoustic velocity regions becomes greater than about 0.7λ, and thus deviates from an optimum condition for transverse mode reduction or prevention, ripples due to the third and fifth transverse modes increase. By contrast, it can be appreciated from FIG. 3 that, with the first preferred embodiment, ripples due to the third and fifth transverse modes are significant reduced or prevented even for cases, for example, when the width of each of the first and second low acoustic velocity regions is greater than about 0.7λ. The first preferred embodiment thus is able to significant reduce or prevent ripples due to lower-order transverse modes even when a deviation occurs from an optimum condition for transverse mode reduction or prevention.

Decreasing the overlap width of an IDT electrode tends to increase the occurrence of lower-order transverse modes. In this regard, the first preferred embodiment is able to significantly reduce or prevent lower-order transverse modes even at reduced overlap widths of an IDT electrode. This allows for miniaturization of the acoustic wave device.

As with the first preferred embodiment shown in FIG. 1, the first mass addition film 7 preferably has a dimension in the first direction x less than the dimension in the first direction x of the second mass addition film 8, for example. This configuration provides significant reduction or prevention of lower-order transverse modes while reducing impact on the reduction or prevention of higher-order transverse modes.

The first mass addition film 7 preferably has a dimension in the second direction y less than the dimension in the second direction y of the second mass addition film 8, for example. This configuration also provides significant reduction or prevention of lower-order transverse modes while reducing impact on the reduction or prevention of higher-order transverse modes.

In the first preferred embodiment, the first mass addition film 7 and the second mass addition film 8 preferably have a rectangular or substantially rectangular shape in plan view. The first mass addition film 7 and the second mass addition film 8 may not necessarily have the above-mentioned shape in plan view but may have, for example, an elliptical or substantially elliptical shape in plan view.

As shown in FIG. 1, the second mass addition film 8 is provided on the first and second edge regions Ca and Cb of each of the first and second electrode fingers 4b and 5b. Alternatively, the second mass addition film 8 may be provided on at least one of the first and second edge regions Ca and Cb of each first electrode finger 4b. The same or similar features apply for the second mass addition film 8 on each second electrode finger 5b.

First to third modifications of the first preferred embodiment will be described below. As with the first preferred embodiment, the first to third modifications also are able to significant reduce or prevent ripples due to lower-order transverse modes.

Figure 4:
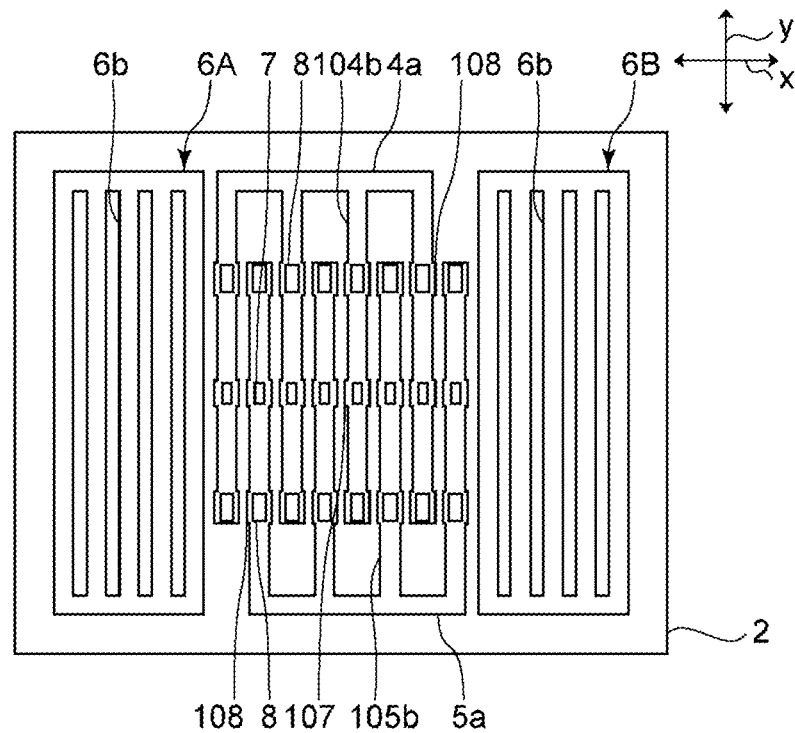
FIG. 4 is a plan view of an acoustic wave device according to a first modification of the first preferred embodiment of the present invention.

FIG. 4 is a plan view of an acoustic wave device according to a first modification of the first preferred embodiment. The dimension in the first direction x of each of first electrode fingers 104b and second electrode fingers 105b is defined as the width of each of the first electrode fingers 104b and the second electrode fingers 105b. The first modification differs from the first preferred embodiment in that the first electrode fingers 104b and the second electrode fingers 105b each have a wider portion 107 and a wider portion 108 that have greater widths than other portions. Otherwise, the acoustic wave device according to the first modification is similar in configuration to the acoustic wave device 1 according to the first preferred embodiment.

More specifically, the wider portion 107 is located in a portion of the central region where the first mass addition film 7 is provided. The wider portion 108 is located in each of the first edge region and the second edge region. The presence of the wider portion 107 and the first mass addition film 7 results in reduced acoustic velocity in the low acoustic velocity portion. The presence of the wider portion 108 and the second mass addition film 8 results in reduced acoustic velocity in each of the first low acoustic velocity region and the second low acoustic velocity region. In an alternative configuration, the first mass addition film 7 and the second mass addition film 8 may not be provided, and a decrease in acoustic velocity may be provided by the presence of the wider portion 107 and the wider portion 108.

Figure 5:
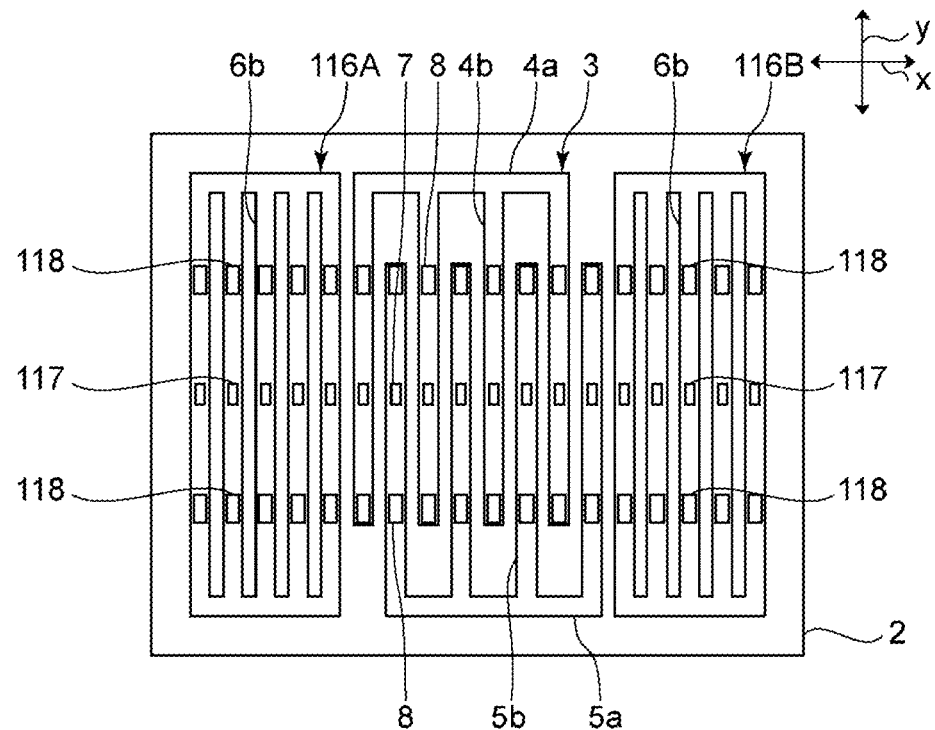
FIG. 5 is a plan view of an acoustic wave device according to a second modification of the first preferred embodiment of the present invention.

FIG. 5 is a plan view of an acoustic wave device according to a second modification of the first preferred embodiment.

The second modification differs from the first preferred embodiment in that a third mass addition film 117 and a third mass addition film 118 are provided on each electrode finger 6b of each of reflectors 116A and 116B. The third mass addition film 117 is similar in configuration to the first mass addition film 7, and the third mass addition film 118 is similar in configuration to the second mass addition film 8. Otherwise, the acoustic wave device according to the second modification is similar in configuration to the acoustic wave device 1 according to the first preferred embodiment.

The third mass addition film 117 on each of the reflectors 116A and 116B is provided at a position overlapping a plurality of first mass addition films 7 on the IDT electrode 3 in the first direction x. Similarly, a plurality of third mass addition films 118 on each of the reflectors 116A and 116B are provided at a position overlapping a plurality of second mass addition films 8 on the IDT electrode 3 in the first direction x.

The third mass addition film 117 and the third mass addition film 118 may be similar to each other in configuration. Further, the respective locations and numbers of third mass addition films 117 and 118 are not particularly limited.

As with the first preferred embodiment, the IDT electrode 3, the reflector 116A, and the reflector 116B according to the second modification can be formed by a method, such as a lift-off method, for example. In the second modification, the reflector 116A and the reflector 116B each include the third mass addition film 117 and the third mass addition film 118 that are positioned on each electrode finger 6b. This facilitates entry of a stripping solution used to strip a resist pattern into an area corresponding to each of the reflectors 116A and 116B. This provides reliable stripping of a resist pattern in a manufacturing process employing a lift-off method.

Figure 6:
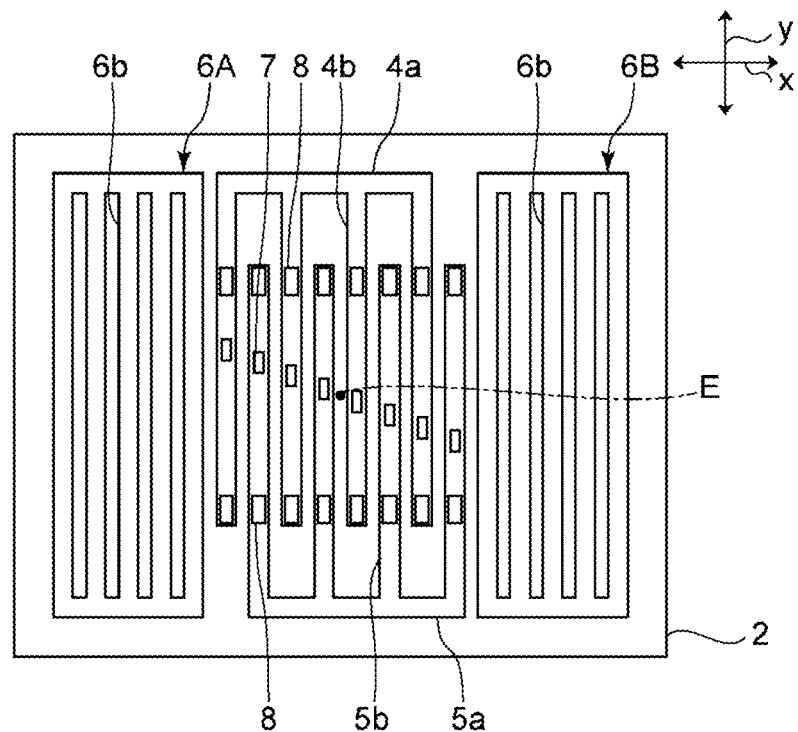
FIG. 6 is a plan view of an acoustic wave device according to a third modification of the first preferred embodiment of the present invention.

FIG. 6 is a plan view of an acoustic wave device according to a third modification of the first preferred embodiment.

The third modification differs from the first preferred embodiment in how the first mass addition film 7 is positioned. Otherwise, the acoustic wave device according to the third modification is similar in configuration to the acoustic wave device 1 according to the first preferred embodiment. More specifically, a plurality of first mass addition films 7 are arranged to lie in a line extending in a direction crossing the first direction x. The first mass addition films 7 are arranged in point symmetry about the center E of the central region with respect to the first direction x and the second direction y.

Figure 7:
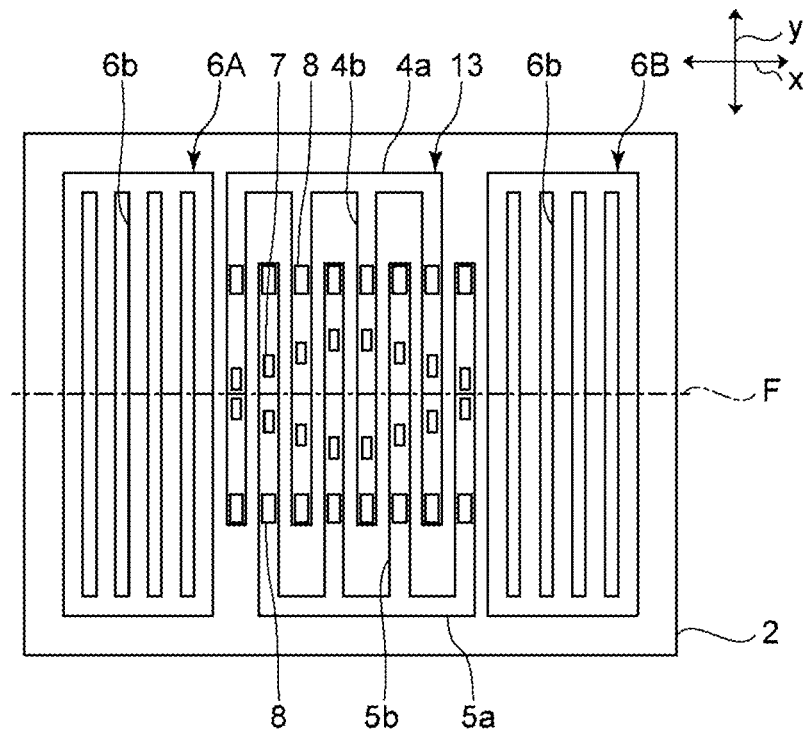
FIG. 7 is a plan view of an acoustic wave device according to a second preferred embodiment of the present invention.

FIG. 7 is a plan view of an acoustic wave device according to a second preferred embodiment of the present invention.

The second preferred embodiment differs from the first preferred embodiment in that in plan view, a plurality of first mass addition films 7 are arranged in a rhombic configuration. Otherwise, the acoustic wave device according to the second preferred embodiment is similar in configuration to the acoustic wave device 1 according to the first preferred embodiment.

A plurality of first mass addition films 7 are provided on each first electrode finger 4b. Similarly, a plurality of first mass addition films 7 are provided on each second electrode fingers 5b. As a result, in forming an IDT electrode 13 by a lift-off method, a stripping solution used to strip a resist pattern is allowed to readily flow into an area corresponding to each of the first and second electrode fingers 4b and 5b. This provides reliable stripping of a resist pattern in a manufacturing process employing a lift-off method.

A plurality of first mass addition films 7 are arranged in line symmetry about an axis F, which is located at the center of the central region with respect to the second direction y and extends in the first direction x. Further, the first mass addition films 7 are arranged in point symmetry about the center of the central region with respect to the first direction x and the second direction y. As with the first preferred embodiment, the second preferred embodiment is able to significantly reduce or prevent ripples due to lower-order transverse modes.

Figure 8:
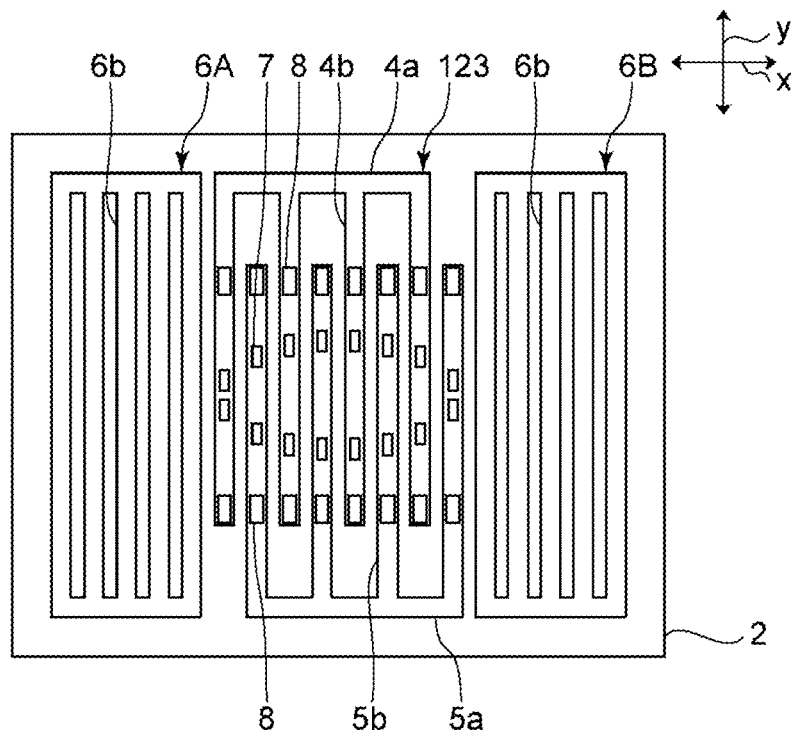
FIG. 8 is a plan view of an acoustic wave device according to a modification of the second preferred embodiment of the present invention.

FIG. 8 is a plan view of an acoustic wave device according to a modification of the second preferred embodiment.

In the modification of the second preferred embodiment, a plurality of first mass addition films 7 are arranged in an elliptical or substantially elliptical configuration in plan view. This configuration also is able to significantly reduce or prevent ripples due to lower-order transverse modes. In addition, this configuration provides reliable stripping of a resist pattern in forming an IDT electrode 123 by a lift-off method.

Third to eighth preferred embodiments will be described below. In the third to eighth preferred embodiments, the third mass addition film is provided on each reflector as with the second modification of the first preferred embodiment shown in FIG. 5. As with the second modification of the first preferred embodiment, the third to eighth preferred embodiments also are able to significantly reduce or prevent ripples due to lower-order transverse modes. In addition, the third to eight preferred embodiments provide reliable stripping of a resist pattern in forming an IDT electrode and each reflector by a lift-off method.

Figure 9:
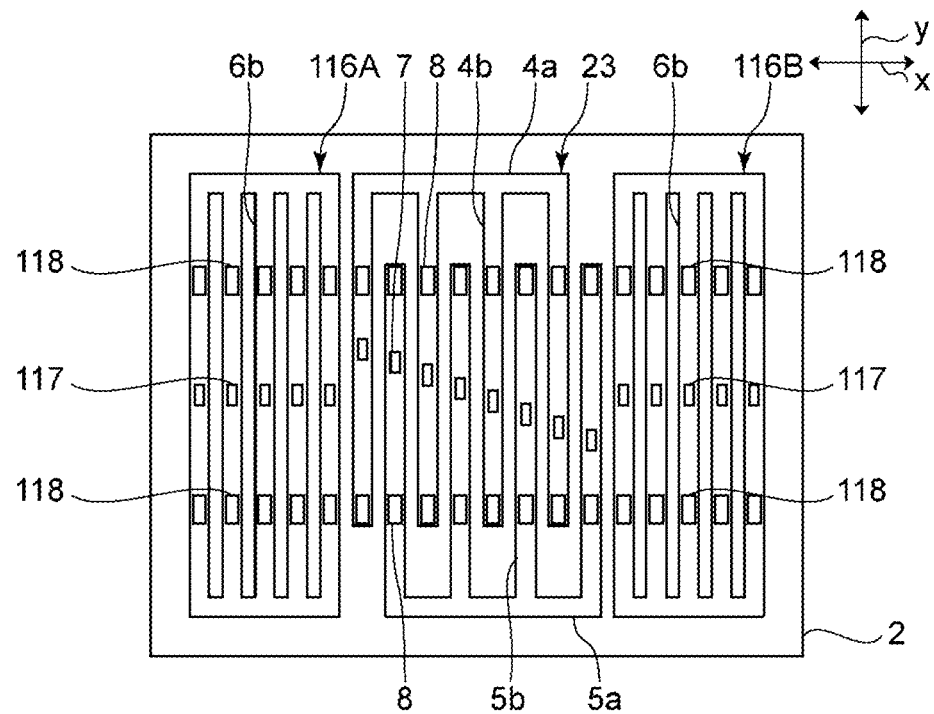
FIG. 9 is a plan view of an acoustic wave device according to a third preferred embodiment of the present invention.

FIG. 9 is a plan view of an acoustic wave device according to a third preferred embodiment of the present invention.

In the third preferred embodiment, as with the third modification of the first preferred embodiment, a plurality of first mass addition films 7 are arranged to lie in a line extending in a direction crossing the first direction x. The third preferred embodiment differs from the third modification of the first preferred embodiment in that the third mass addition film 117 is provided similar to the second modification of the first preferred embodiment. Otherwise, the acoustic wave device according to the third preferred embodiment is similar in configuration to the acoustic wave device according to the third modification of the first preferred embodiment.

Figure 10:
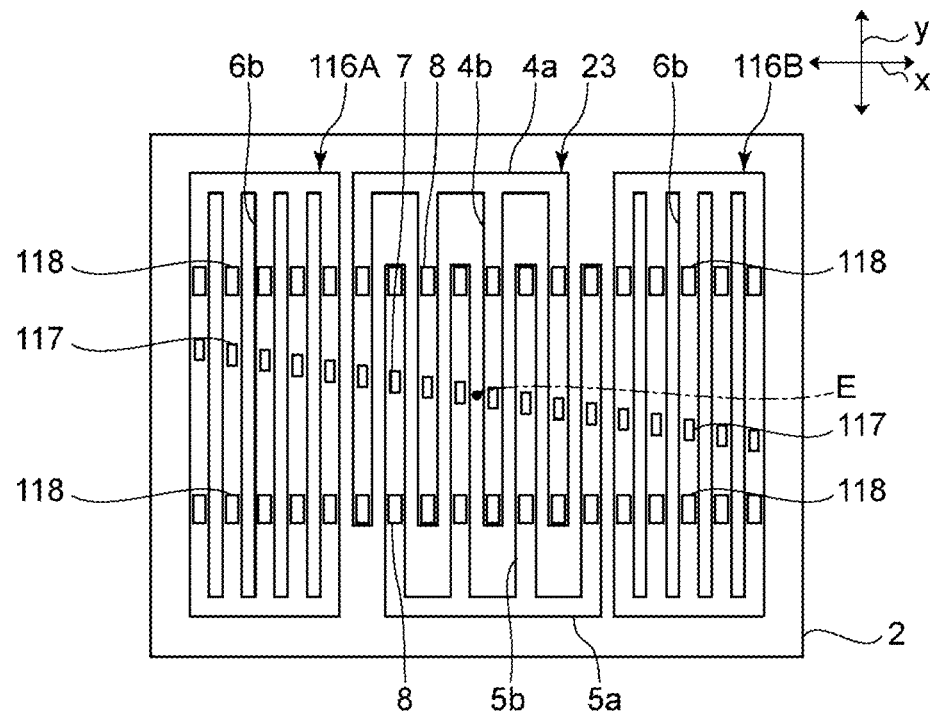
FIG. 10 is a plan view of an acoustic wave device according to a fourth preferred embodiment of the present invention.

FIG. 10 is a plan view of an acoustic wave device according to a fourth preferred embodiment.

The fourth preferred embodiment differs from the third preferred embodiment in how the first mass addition film 7 is positioned on an IDT electrode 23, and how the third mass addition film 117 is positioned on each of the reflectors 116A and 116B. Otherwise, the acoustic wave device according to the fourth preferred embodiment is similar in configuration to the acoustic wave device according to the third preferred embodiment.

A plurality of first mass addition films 7 and a plurality of third mass addition films 117 are arranged to lie in a line extending in a direction crossing the first direction x. In the fourth preferred embodiment, the line in which the first mass addition films 7 and the third mass addition films 117 lie passes through the center E of the central region with respect to the first direction x and the second direction y. As described above, in addition to the first mass addition films 7, the third mass addition films 117 may be also arranged in point symmetry about the center E.

Figure 11:
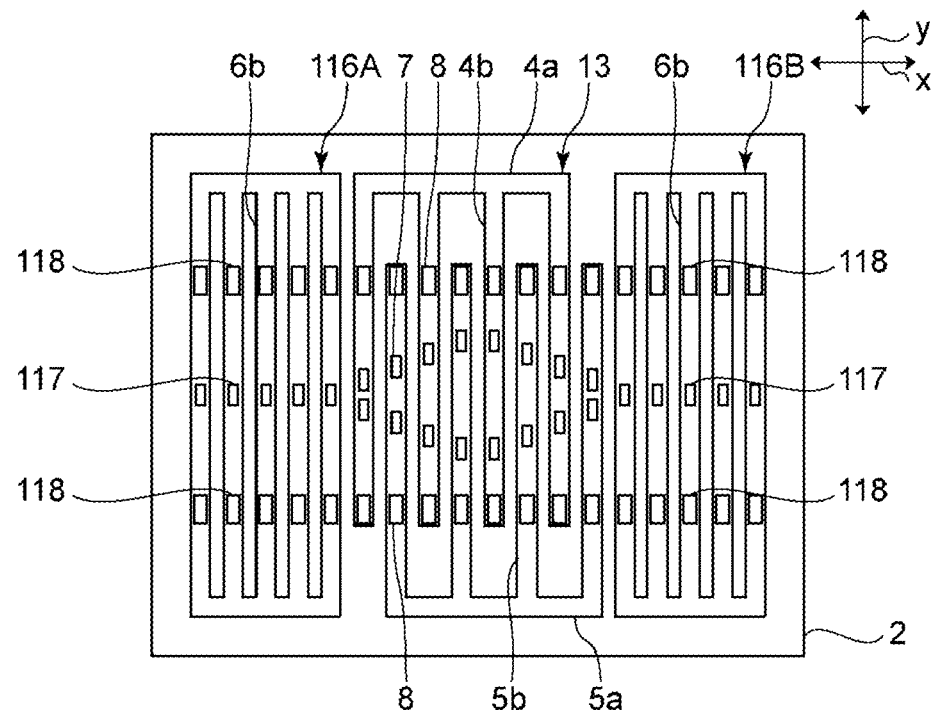
FIG. 11 is a plan view of an acoustic wave device according to a fifth preferred embodiment of the present invention.

FIG. 11 is a plan view of an acoustic wave device according to a fifth preferred embodiment of the present invention.

In the fifth preferred embodiment, as with the second preferred embodiment, a plurality of first mass addition films 7 define a rhombus in plan view. The fifth preferred embodiment differs from the second preferred embodiment in that the third mass addition film 117 is provided similar to the second modification of the first preferred embodiment. Otherwise, the acoustic wave device according to the fifth preferred embodiment is similar in configuration to the acoustic wave device according to the second preferred embodiment.

Figure 12:
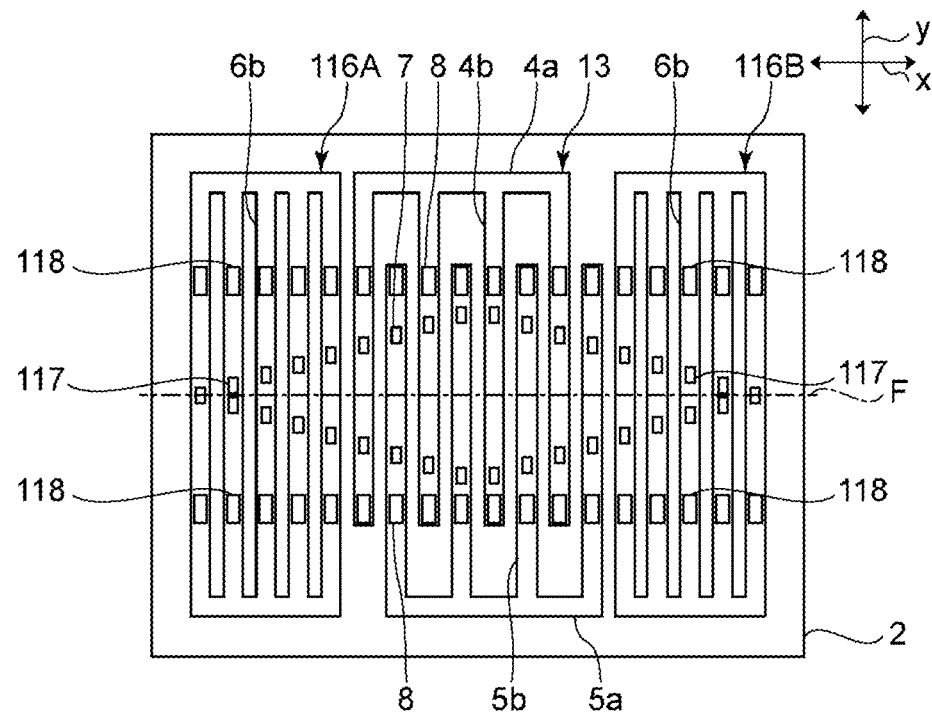
FIG. 12 is a plan view of an acoustic wave device according to a sixth preferred embodiment of the present invention.

FIG. 12 is a plan view of an acoustic wave device according to a sixth preferred embodiment of the present invention.

The sixth preferred embodiment differs from the fifth preferred embodiment in how the first mass addition film 7 is positioned on the IDT electrode 13 and how the third mass addition film 117 is positioned on each of the reflectors 116A and 116B. Otherwise, the acoustic wave device according to the sixth preferred embodiment is similar in configuration to the acoustic wave device according to the fifth preferred embodiment.

A plurality of first mass addition films 7 and a plurality of third mass addition films 117 define a rhombus in plan view. A plurality of third mass addition films 117 are provided on the electrode fingers 6b of the reflector 116A except for the electrode finger 6b positioned most distant from the IDT electrode 13. A single third mass addition film 117 is provided on the electrode finger 6b of the reflector 116A positioned most distant from the IDT electrode 13. Similarly, a plurality of third mass addition films 117 are provided on the electrode fingers 6b of the reflector 116B except for the electrode finger 6b positioned most distant from the IDT electrode 13. A single third mass addition film 117 is provided on the electrode finger 6b of the reflector 116B positioned most distant from the IDT electrode 13. Alternatively, however, a plurality of third mass addition films 117 may be provided on all of the electrode fingers 6b.

In the sixth preferred embodiment, in addition to a plurality of first mass addition films 7, a plurality of third mass addition films 117 are also arranged in line symmetry about the axis F, which is located at the center of the central region with respect to the second direction y and extends in the first direction x. Further, the first mass addition films 7 and the third mass addition films 117 are arranged in point symmetry about the center of the central region with respect to the first direction x and the second direction y.

Figure 13:
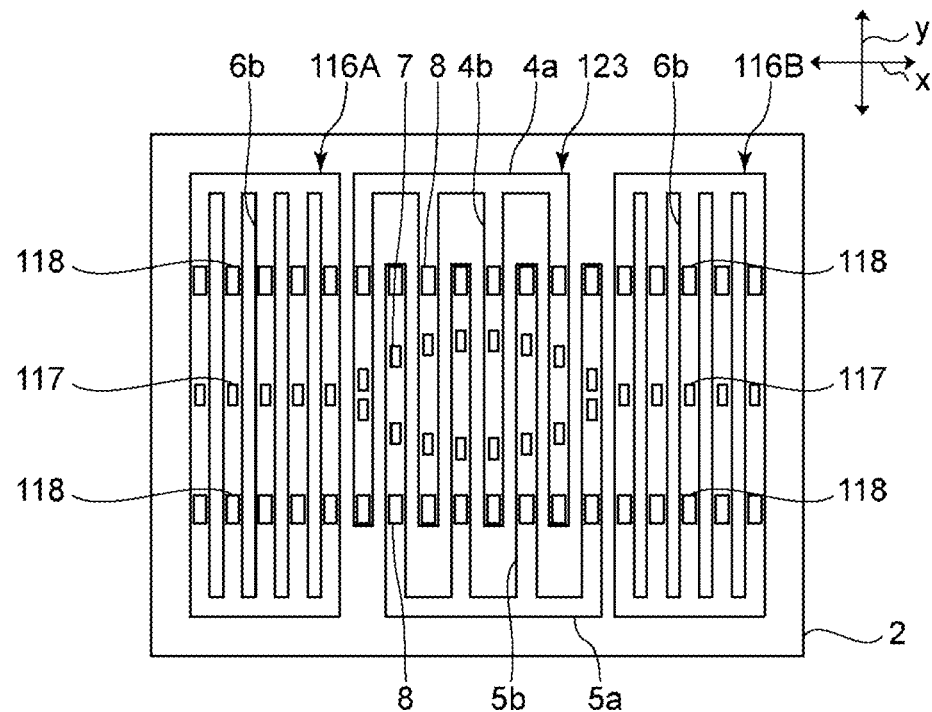
FIG. 13 is a plan view of an acoustic wave device according to a seventh preferred embodiment of the present invention.

FIG. 13 is a plan view of an acoustic wave device according to a seventh preferred embodiment of the present invention.

In the seventh preferred embodiment, a plurality of first mass addition films 7 define an elliptical or substantially elliptical shape in plan view. The seventh preferred embodiment differs from the modification of the second preferred embodiment in that the third mass addition film 117 is provided similar to the second modification of the first preferred embodiment. Otherwise, the acoustic wave device according to the seventh preferred embodiment is similar in configuration to the acoustic wave device according to the modification of the second preferred embodiment.

Figure 14:
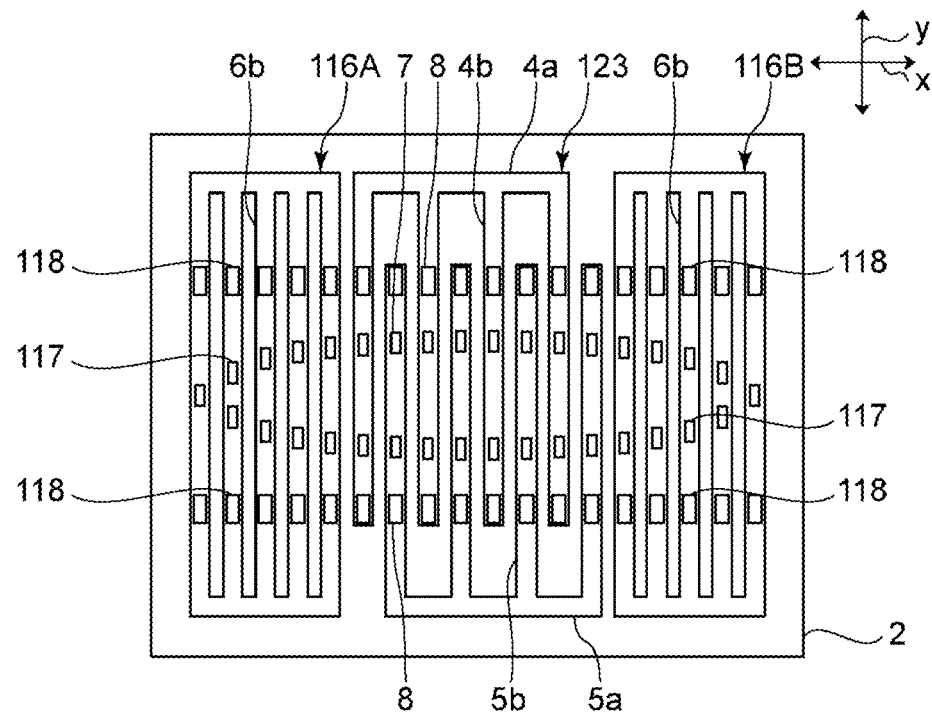
FIG. 14 is a plan view of an acoustic wave device according to an eighth preferred embodiment of the present invention.

FIG. 14 is a plan view of an acoustic wave device according to an eighth preferred embodiment.

The eighth preferred embodiment differs from the seventh preferred embodiment in how the first mass addition film 7 is positioned on the IDT electrode 123 and how the third mass addition film 117 is positioned on each of the reflectors 116A and 116B. Otherwise, the acoustic wave device according to the eighth preferred embodiment is similar in configuration to the acoustic wave device according to the seventh preferred embodiment.

A plurality of first mass addition films 7 and a plurality of third mass addition films 117 define an elliptical or substantially elliptical shape in plan view. As with the sixth preferred embodiment, the first mass addition films 7 and the third mass addition films 117 are arranged in line symmetry about the axis F, which is located at the center of the central region with respect to the second direction y and extends in the first direction x. Further, the first mass addition films 7 and the third mass addition films 117 are arranged in point symmetry about the center of the central region with respect to the first direction x and the second direction y.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate; and
   an interdigital transducer (IDT) electrode provided on the piezoelectric substrate; wherein
   the IDT electrode includes:
      a first busbar and a second busbar that face each other;
      a plurality of first electrode fingers and a plurality of second electrode fingers, the first electrode fingers being connected at one end to the first busbar, the second electrode fingers being connected at one end to the second busbar and interdigitated with the first electrode fingers; and
      an overlap region where, when a direction of acoustic wave propagation is defined as a first direction and a direction orthogonal or substantially orthogonal to the direction of acoustic wave propagation is defined as a second direction, the first electrode fingers and the second electrode fingers overlap each other in the first direction;
   the overlap region includes a central region located in a substantially central portion of the overlap region with respect to the second direction, the central region including a low acoustic velocity portion with an acoustic velocity less than an acoustic velocity in another portion of the central region;
   the low acoustic velocity portion is provided at a position including a center of the central region with respect to the second direction;
   the overlap region includes:
      a first low acoustic velocity region located on a first-bulbar side from the central region, the first low acoustic velocity region being a region with an acoustic velocity less than the acoustic velocity in the another portion of the central region; and
      a second low acoustic velocity region located on a second-bulbar side from the central region, the second low acoustic velocity region being a region with an acoustic velocity less than the acoustic velocity in the another portion of the central region;
   the IDT electrode includes:
      a first high acoustic velocity region with an acoustic velocity greater than an acoustic velocity in the central region; and a second high acoustic velocity region with an acoustic velocity greater than the acoustic velocity in the central region;

the first high acoustic velocity region is located outside the first low acoustic velocity region with respect to the second direction;

the second high acoustic velocity region is located outside the second low acoustic velocity region with respect to the second direction; and a dimension of the low acoustic velocity portion defined by a first mass addition film is less than a dimension of at least one of the first and second low acoustic velocity regions defined by a second mass addition film in the first direction.

2. The acoustic wave device according to claim 1, wherein the low acoustic velocity portion is defined by providing the first mass addition film on at least one of each first electrode finger and each second electrode finger.

3. The acoustic wave device according to claim 2, wherein a plurality of the first mass addition films are provided, the first mass addition films being provided on at least one electrode finger, the at least one electrode finger being at least one electrode finger among the first electrode fingers and the second electrode fingers.

4. The acoustic wave device according to claim 3, wherein the first mass addition films are provided in line symmetry about an axis, the axis being located at the center of the central region with respect to the second direction and extending in the first direction.

5. The acoustic wave device according to claim 2, wherein
the first low acoustic velocity region and the second low acoustic velocity region are each defined by providing the second mass addition film on at least one of each first electrode finger and each second electrode finger; and the first mass addition film has a dimension in the second direction less than a dimension in the second direction of the second mass addition film.

6. The acoustic wave device according to claim 2, wherein
the first low acoustic velocity region and the second low acoustic velocity region are each defined by providing the second mass addition film on at least one of each first electrode finger and each second electrode finger; and the first mass addition film has a dimension in the first direction less than a dimension in the first direction of the second mass addition film.

7. The acoustic wave device according to claim 2, wherein a plurality of the first mass addition films are provided, the first mass addition films being provided in point symmetry about a center of the central region with respect to the first direction and the second direction.

8. The acoustic wave device according to claim 2, wherein a plurality of the first mass addition films are provided, the first mass addition films being provided at a position including the center of the central region with respect to the second direction, the first mass addition films being aligned in the first direction.

9. The acoustic wave device according to claim 2, wherein the first mass addition film includes a multilayer metal film including a Ti layer, a Pt layer, and a Ti layer stacked in order on the at least one of each first electrode finger and each second electrode finger.

10. The acoustic wave device according to claim 2, wherein
the first low acoustic velocity region and the second low acoustic velocity region are each defined by providing a second mass addition film on at least one of each first electrode finger and each second electrode finger; and the second mass addition film is provided in a first edge region located on the first-busbar side from the central region, and a second edge region located on the second-busbar side from the central region.

11. The acoustic wave device according to claim 2, wherein the first mass addition film has a rectangular, substantially rectangular, elliptical, or substantially elliptical shape in plan view.

12. The acoustic wave device according to claim 1, wherein the acoustic velocity in each of the first low acoustic velocity region and the second low acoustic velocity region is less than the acoustic velocity in the low acoustic velocity portion of the central region.

13. The acoustic wave device according to claim 1, wherein the low acoustic velocity portion has a dimension in the second direction less than a dimension in the second direction of each of the first low acoustic velocity region and the second low acoustic velocity region.

14. The acoustic wave device according to claim 1, wherein
on the piezoelectric substrate, a reflector including a plurality of electrode fingers is located at least on one side of the IDT electrode with respect to the first direction; and a third mass addition film is provided on each of the electrode fingers of the reflector.

15. The acoustic wave device according to claim 1, wherein the IDT electrode includes a multilayer metal film including a NiCr layer, a Pt layer, a Ti layer, an AlCu layer, and a Ti layer stacked in order on the piezoelectric substrate.

16. The acoustic wave device according to claim 1, wherein
on the piezoelectric substrate, a reflector including a plurality of electrode fingers is located at least on one side of the IDT electrode with respect to the first direction; and a plurality of third mass addition film are provided on each of the electrode fingers of the reflector except for the electrode finger positioned most distant from the IDT electrode.

17. The acoustic wave device according to claim 1, wherein the overlap region has an overlap width of about 15 times a wave length defined by the electrode finger pitch of the IDT electrode.

18. An acoustic wave device comprising:
a piezoelectric substrate; and
an interdigital transducer (IDT) electrode provided on the piezoelectric substrate; wherein
the IDT electrode includes:
a first busbar and a second busbar that face each other;
a plurality of first electrode fingers and a plurality of second electrode fingers, the first electrode fingers being connected at one end to the first busbar, the second electrode fingers being connected at one end to the second bulbar and interdigitated with the first electrode fingers; and
an overlap region where, when a direction of acoustic wave propagation is defined as a first direction and a direction orthogonal or substantially orthogonal to the direction of acoustic wave propagation is defined as a second direction, the first electrode fingers and the second electrode fingers overlap each other in the first direction;

the overlap region includes a central region located in a substantially central portion of the overlap region with respect to the second direction, the central region including a low acoustic velocity portion with an acoustic velocity less than an acoustic velocity in another portion of the central region;

the low acoustic velocity portion of at least one of the first electrode fingers is offset in the second direction from the low acoustic velocity portion of one of the second electrode fingers that is adjacent to the at least one of the first electrode fingers in the first direction;

the overlap region includes:
  a first low acoustic velocity region located on a first-bulbar side from the central region, the first low acoustic velocity region being a region with an acoustic velocity less than the acoustic velocity in the another portion of the central region; and
  a second low acoustic velocity region located on a second-bulbar side from the central region, the second low acoustic velocity region being a region with an acoustic velocity less than the acoustic velocity in the another portion of the central region;

the IDT electrode includes:
  a first high acoustic velocity region with an acoustic velocity greater than an acoustic velocity in the central region; and
  a second high acoustic velocity region with an acoustic velocity greater than the acoustic velocity in the central region;

the first high acoustic velocity region is located outside the first low acoustic velocity region with respect to the second direction;

the second high acoustic velocity region is located outside the second low acoustic velocity region with respect to the second direction; and a dimension of the low acoustic velocity portion defined by a first mass addition film is less than a dimension of at least one of the first and second low acoustic velocity regions defined by a second mass addition film in the first direction.

* * * * *